United States Patent
Jabir et al.

(10) Patent No.: US 11,646,749 B2
(45) Date of Patent: May 9, 2023

(54) MEMRISTOR-BASED CIRCUIT AND METHOD

(71) Applicant: Oxford Brookes University, Oxford (GB)

(72) Inventors: Abusaleh Jabir, Oxford (GB); Saurabh Khandelwal, Oxford (GB); Xiaohan Yang, Oxford (GB)

(73) Assignee: OXFORD BROOKES UNIVERSITY, Oxford (GB)

( * ) Notice: Subject to any disclaimer, the term of this patent is extended or adjusted under 35 U.S.C. 154(b) by 0 days.

(21) Appl. No.: 17/594,416

(22) PCT Filed: Apr. 15, 2020

(86) PCT No.: PCT/EP2020/060620
§ 371 (c)(1),
(2) Date: Oct. 15, 2021

(87) PCT Pub. No.: WO2020/212443
PCT Pub. Date: Oct. 22, 2020

(65) Prior Publication Data
US 2022/0329254 A1    Oct. 13, 2022

(30) Foreign Application Priority Data
Apr. 16, 2019 (GB) ..................... 1905392

(51) Int. Cl.
*H03M 1/12* (2006.01)
*H03M 1/36* (2006.01)
*H03M 1/60* (2006.01)

(52) U.S. Cl.
CPC ............. *H03M 1/362* (2013.01); *H03M 1/60* (2013.01)

(58) Field of Classification Search
CPC ................................ H03M 1/362; H03M 1/60
(Continued)

(56) References Cited

U.S. PATENT DOCUMENTS 9,805,770 B1    10/2017   Merced Grafals et al.
2010/0165722 A1   7/2010   Sheu et al.
(Continued)

FOREIGN PATENT DOCUMENTS

CN    105897269 A    8/2016
CN    106899297 A    6/2017
(Continued)

OTHER PUBLICATIONS

Arafin, Tanvir and Gang, Qu, "Memristors for Secret Sharing-Based Lightweight Authentication." IEEE Transactions on Very Large Scale Integration (VLSI) Systems, vol. 26, No. 12, Dec. 2018, pp. 2671-2683.
(Continued)

*Primary Examiner* — Peguy Jean Pierre
(74) *Attorney, Agent, or Firm* — William J. Clemens; Shumaker, Loop & Kendrick, LLP

(57) ABSTRACT

A memristor-based circuit includes a voltage generator that applies a series of voltage pulses to a memristor to progressively change the resistance of the memristor. A comparator: receives an input electrical value; receives an electrical value based on the resistance of the memristor; compares the received values; and, based on the comparison, enables the application of the voltage pulses to the memristor by the voltage generator until a defined condition is satisfied. This circuit can be used to enable the memristor to be programmed to a desired resistance value, such as for use as a non-volatile memory. It can also enable the resistance of one memristor to be replicated to another memristor. By counting the number of applied voltage pulses, the circuit can be used as an encoder or analog-to-digital converter. Other variants of the circuit enable construction of a decoder or digital-to-analog converter, and an authentication circuit.

17 Claims, 5 Drawing Sheets

(58) Field of Classification Search
USPC .......................................................... 341/155
See application file for complete search history.

(56) References Cited

U.S. PATENT DOCUMENTS

| | | |
|---|---|---|
| 2011/0182104 A1 | 7/2011 | Kim et al. |
| 2018/0108410 A1* | 4/2018 | Whitaker ............ G11C 13/0064 |
| 2021/0217469 A1* | 7/2021 | Min ........................ G06N 3/065 |
| 2022/0207338 A1* | 6/2022 | Li ........................... G06N 3/049 |

FOREIGN PATENT DOCUMENTS

| | | |
|---|---|---|
| WO | 2011099961 A1 | 8/2011 |
| WO | 2015134037 A1 | 9/2015 |
| WO | 2015167551 A1 | 11/2015 |
| WO | 2018057766 A1 | 3/2018 |

OTHER PUBLICATIONS

United Kingdom Search Report dated Oct. 1, 2019.

* cited by examiner

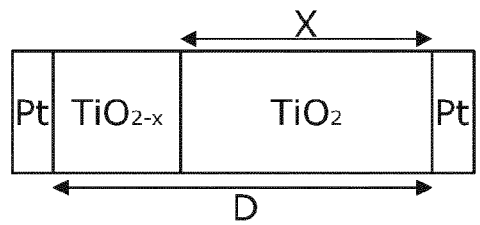
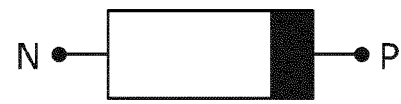
Fig. 1A    Fig. 1B
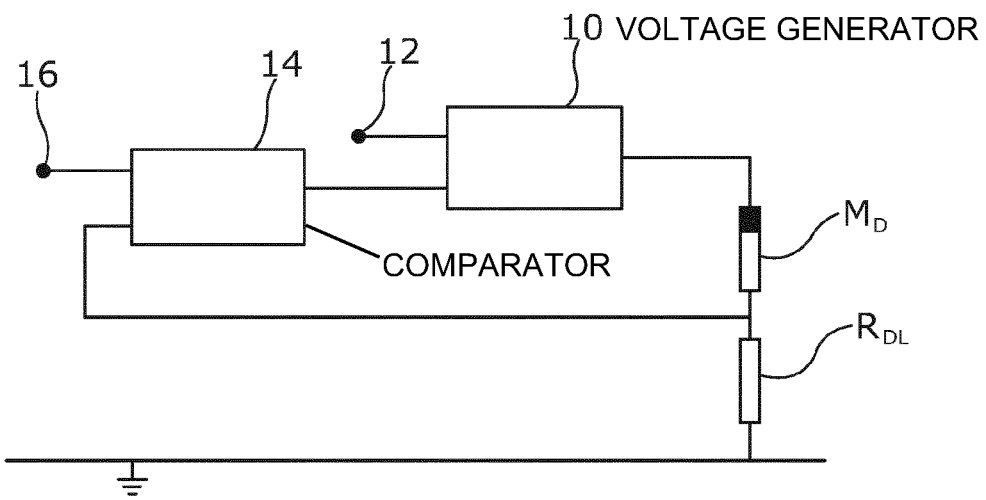
Fig. 2
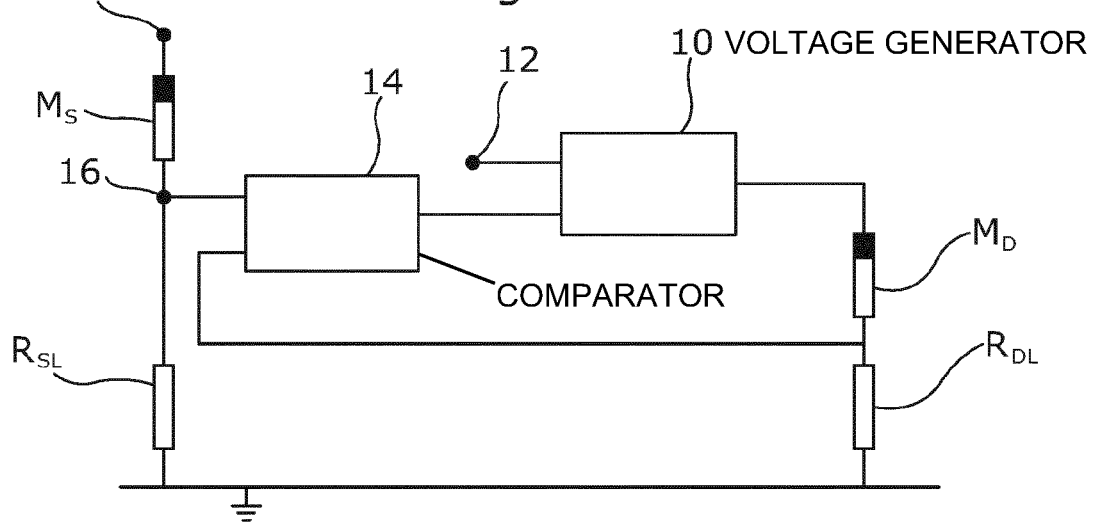
Fig. 3

MEMRISTOR-BASED CIRCUIT AND METHOD

FIELD OF THE INVENTION

The present invention relates to a memristor-based circuit and method, for example for replicating a memristor resistance, performing encoding and decoding, and for use in authentication.

BACKGROUND OF THE INVENTION

A memristor is a circuit element in which there has been a lot of interest for use in the designs of high density non-volatile memory, neuromorphic systems, logic design, and most recently in sensors and solar cells. This is due to the non-volatility and fine resolution programmability. Conventional techniques for tuning a memristor's resistance to a predetermined value involve programming. These programming techniques however suffer from requiring external processing to accurately tune the memristor. A programming approach, although accurate, also has the drawback of not being able to program devices of high ON/OFF ratio.

Additionally, analog-to-digital converters (ADCs) are widely used in modern electronics to represent (encode) values of analog signals in digital form for subsequent storage and/or logic processing by traditional micro-controllers. There is a problem of making simple, compact, low-power encoders and decoders.

There is also a need to be able to securely tag chips or other electronic circuits for authentication purposes i.e. to identify unauthorized clones and identify authentic ones.

SUMMARY OF THE INVENTION

The present invention has been devised in view of the above problems.

Accordingly, one aspect of the present invention provides a memristor-based circuit, comprising:
a memristor;
a voltage generator arranged to apply a series of voltage pulses to the memristor to incrementally change the resistance of the memristor; and
a comparator arranged to receive an input electrical value, to receive an electrical value based on the resistance of the memristor, to compare the received values, and based on the comparison to enable the application of the voltage pulses to the memristor by the voltage generator until a defined condition is satisfied.

Another aspect of the invention provides an encoder comprising:
a memristor;
a voltage generator arranged to apply a series of voltage pulses to the memristor to incrementally change the resistance of the memristor;
a comparator arranged to receive an input electrical value, to receive an electrical value based on the resistance of the memristor, to compare the received values, and based on the comparison to enable the application of the voltage pulses to the memristor by the voltage generator until a defined condition is satisfied; and
a counter arranged to count the number of voltage pulses applied to the memristor, and to output that number.

Another aspect of the invention provides a decoder comprising:
a memristor;
a voltage generator arranged to apply a series of voltage pulses to the memristor to incrementally change the resistance of the memristor; and
a counter, arranged to receive a number as an input, and arranged to cause the voltage generator to apply that number of voltage pulses to the memristor.

Another aspect of the invention provides an authentication circuit connectable to a memristor provided in an external circuit, the authentication circuit comprising:
a voltage generator arranged to apply a series of voltage pulses to the memristor to incrementally change the resistance of the memristor;
a comparator arranged to receive an input electrical value, to receive an electrical value based on the resistance of the memristor, to compare the received values, and based on the comparison to enable the application of the voltage pulses to the memristor by the voltage generator until a defined condition is satisfied; and
a counter arranged to count the number of voltage pulses applied to the memristor, and to output that number,
wherein the input electrical value comprises a challenge, and wherein the output number comprises a response based on the memristor of the external circuit.

Another aspect of the invention provides an authentication circuit connectable to a memristor provided in an external circuit, the authentication circuit comprising:
a voltage generator arranged to apply a series of voltage pulses to the memristor to incrementally change the resistance of the memristor; and
a counter, arranged to receive a number as an input, and arranged to cause the voltage generator to apply that number of voltage pulses to the memristor,
wherein the number received as the input comprises a challenge, and wherein an electrical value based on the final resistance of the memristor of the external circuit comprises a response.

Another aspect of the present invention provides a method comprising: receiving an input electrical value; applying a series of voltage pulses to a memristor to incrementally change the resistance of the memristor;
receiving an electrical value based on the resistance of the memristor; and comparing the received values, and, based on the comparison, enabling the application of the voltage pulses to the memristor until a defined condition is satisfied.

Another aspect of the present invention provides a method comprising:
receiving an input electrical value;
applying a series of voltage pulses to a memristor to incrementally change the resistance of the memristor;
receiving an electrical value based on the resistance of the memristor;
comparing the received values, and, based on the comparison, enabling the application of the voltage pulses to the memristor until a defined condition is satisfied; and
counting the number of voltage pulses applied to the memristor, and outputting that number.

Another aspect of the invention provides a method comprising:
receiving a number as an input;
applying a series of voltage pulses to a memristor to incrementally change the resistance of the memristor;
counting such that the number of voltage pulses applied to the memristor is equal to the number received as an input; and
outputting an electrical value based on the resulting resistance of the memristor.

Embodiments of the invention can provide a simple and efficient lightweight memristor replicator architecture, which is able to replicate the resistance of a source memristor into a destination memristor by repeatedly applying programming pulses. Such a circuit can be used for backing up analog data, e.g. from a memristor sensor, before or during conversion to digital form. The proposed circuit architecture is extremely versatile and can be used not only for replicating memristors, but also for generating non-linear digital code and decoding the code back to the source memristance/voltage (within quantization limits). Owing to the nonlinear encoding, the architecture also provides a level of inherent security features. Memristors can offer physical uncloneability, so embodiments of the invention can be used in applications such as chip tagging/identification, as well as for preventing unauthorized fabrications. Owing to their simple and versatile nature, embodiments of the invention can be used in remote and low power devices which require some level of security, e.g. in remote sensor nodes, etc.

DESCRIPTION OF THE DRAWINGS

Embodiments of the invention will now be described, by way of example only, with reference to the accompanying drawings, in which:

FIGS. 1A and 1B show the structure of a $TiO_2$-based memristor and the corresponding circuit symbol, respectively;

FIG. 2 is a schematic circuit diagram of a memristor circuit according to an embodiment of the invention;

FIG. 3 is a schematic circuit diagram of a memristor replicator circuit according to an embodiment of invention;

In the drawings, like parts are given like reference signs, and duplicate description thereof is omitted.

DETAILED DESCRIPTION OF THE INVENTION

Figure 4:
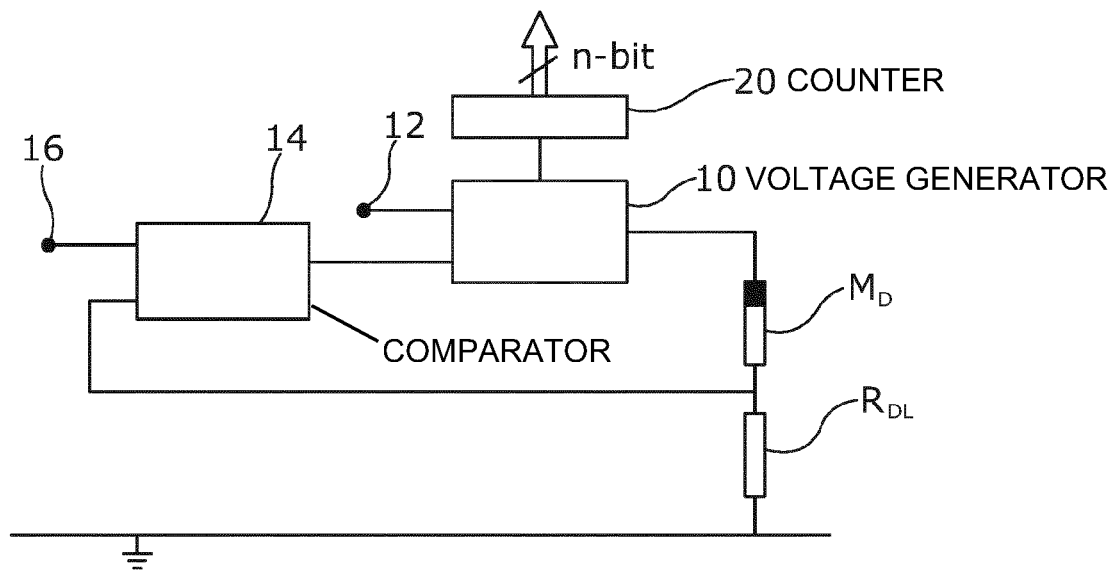
FIG. 4 is a schematic circuit diagram of a memristor-based encoder (or analog-to-digital converter (ADC)) circuit according to an embodiment of invention.

Memristors are known in the art as devices whose electrical resistance (also called memristance) is changed by the electrical current that flows through the device. The resistance has a minimum value $R_{ON}$ and a maximum value $R_{OFF}$. The resistance can be tuned by application of appropriate voltage or current, and is non-volatile (the resistance value is 'remembered'), so that a memristor can be used as a memory element. The resistance can also be influenced by external factors, so a memristor can be used as a sensor element.

Memristors can be made of various materials, such as: $TiO_2$ (for example with doped and undoped regions and with Pt electrodes); $Ag/Ag_5In_5Sb_{60}Te_{30}/Ta$; Ag-a-LSMO-Pt (Ag nano-filaments in amorphous manganite thin films); other metal oxide semiconductors, such as aluminium oxide, copper oxide, silicon oxide, zinc oxide, tantalum oxide, hafnium oxide; amorphous perovskite oxides (such as a-Sr-$TiO_3$); as well as other ferroelectric and doped polymeric materials, and also graphene oxide. Embodiments of the present invention are not limited to any specific material, provided the memristive property is present. A component that acts as a memristor is described herein as being memristive. In the following description, embodiments are based on $TiO_2$ memristors, by way of example only.

Memristors typically manifest non-linear behavior. According to one model the overall resistance of a memristor is determined by the resistance of two regions: an undoped region ($TiO_2$) and a doped region ($TiO_{2-x}$), as shown in FIG. 1A. If the initial resistance of the memristor is $R_{init}$, then for x=0, $R_{init}=R_{on}$ (Low Resistance State) and for x=D, $R_{init}=R_{off}$ (High Resistance State). The lengths (x and D) depicted in this figure will be used in the rest of this description.

In practical memristive devices, the memristance is dependent on a tunnelling effect, which is highly non-linear. Therefore, any change in the tunnel barrier width changes the memristance, and is assumed to change exponentially in x. The instantaneous memristance, $R_M$, is given as in Equation 1

$$R_M = R_{on} \cdot e^{\lambda \cdot (x - x_{on})/(x_{off} - x_{on})} \quad (1)$$

$$\text{where } \lambda = \ln\left(\frac{R_{off}}{R_{on}}\right).$$

$x_{on} \leq x \leq x_{off}$ and $x_{on}$ and $x_{off}$ are the lower and upper bounds of the undoped region.

FIG. 1B shows the symbol of a memristor. Here, P and N are its 'positive' and 'negative' terminals respectively. The memristor switches to High Resistance State ($R_{off}$) when the instantaneous voltage $V_P > V_{off}$ and switches to Low Resistance State ($R_{on}$) when $V_P < V_{on}$, as defined in Equation 2 for $V_{in} = V_P$. The memristor's state does not change, i.e. it is in a 'hold' state, when $V_{on} < V_P < V_{off}$.

$$\frac{dx(t)}{dt} = \begin{cases} K_{off}\left(\frac{V_{in}}{V_{off}} - 1\right)^{\alpha_{off}} F_{off}(x) & 0 < V_{off} < V_{in} \\ 0 & V_{on} < V_{in} < V_{off} \\ K_{on}\left(\frac{V_{in}}{V_{off}} - 1\right)^{\alpha_{on}} F_{on}(x) & V_{in} < V_{on} < 0 \end{cases} \quad (2)$$

$K_{off}$, $K_{on}$, $\alpha_{on}$, $\alpha_{off}$ are constants, and $V_{on}$ and $V_{off}$ are threshold voltages. Functions $F_{off}(x)$ and $F_{on}(x)$ represent the dependence of the derivative of the state variable x. These functions behave as window functions, which constrain the state variable to bounds of $x \in [x_{on}, x_{off}]$.

A write voltage $V_W$ ($0 < V_{off} < V_W$) is applied to shift a memristor's barrier from $R_{on}$ towards $R_{off}$ and a read voltage $V_R$ ($V_{on} < V_R < V_{off}$) is applied to read the resistance/voltage drop across it, as given in Equation 2.

Referring to FIG. 2, a basic circuit is illustrated in which a voltage generator 10 is arranged to apply a voltage across a potential divider circuit comprising a memristor $M_D$ and a load resistor $R_{DL}$. The memristor $M_D$ is initialized to be in the low-resistance state $R_{ON}$. Next, the voltage generator 10 receives a clock signal clk input at terminal 12 that is a substantially rectangular wave repeatedly switching between high level for time $T_{prog}$ and low level for time $T_{hold}$, and generator 10 outputs a programming voltage $V_{prog}$ and a hold voltage $V_{hold}$ during $T_{prog}$ and $T_{hold}$, respectively. $V_{prog}$ is adjusted to be sufficiently high so that $V_W$ appears across memristor $M_D$ taking into account the load $R_{DL}$. Similarly, $V_{hold}$ is adjusted to be sufficiently high such that a $V_R$ appears across memristor $M_D$. In this way, a series of voltage pulses are applied to the memristor $M_D$ which incrementally change the resistance of the memristor.

A comparator 14 receives an input electrical value, in this case an input voltage, at terminal 16. The comparator 14 also receives the voltage from the potential divider comprising the memristor $M_D$. During the periods $T_{hold}$ when the programming voltage pulse is not being applied to the memristor, the comparator compares the two received voltages, optionally with weighting factors. When a defined condition is satisfied, such as the voltage at the potential divider equaling or exceeding the input voltage at terminal 16, then the output of the comparator stops the voltage generator 10 from applying further programming voltage pulses, and the resistance of the memristor is now fixed.

In this way, the resistance of the memristor $M_D$ can be accurately and reproducibly 'programmed' to a value that depends on the input voltage value; and different input voltages will produce different resistances.

FIG. 3 illustrates a development of the circuit of FIG. 2 in which the input terminal 16 is connected to a potential divider comprising a source memristor $M_S$ and a source load resistor $R_{SL}$. The original memristor is now a destination memristor $M_D$. In a preferred embodiment, the load resistors $R_{SL}$ and $R_{DL}$ are matched, and the source and destination memristors $M_S$ and $M_D$ are also matched. The source memristor $M_S$ has a resistance (memristance) value that has already been set, for example the source memristor might be a sensor whose resistance value is related to a property being sensed.

The voltage $V_{hold}$ is applied to the terminal 18 of the source memristor $M_S$, and the memristor $M_D$ is initialized to be in a low-resistance state $R_{ON}$. When the clock signal is now applied to terminal 12, the resistance of the destination memristor is incrementally changed by the programming voltage pulses ($V_{prog}$ during the periods $T_{prog}$) until the two voltages input to the comparator 14 are equal (during the $T_{hold}$ periods) at which point the process is terminated. The result is that the resistance of the source memristor $M_S$ has been replicated to the destination memristor $M_D$.

If different component values are used in the circuit, then the memristor resistances will not necessarily be identical, but the resistance of the destination memristor will be related to the resistance of the source memristor. This embodiment has illustrated how a resistance can be used as an input electrical value to be replicated to another resistance. However, embodiments of the invention can use other things as the input electrical value, such as a voltage or a current. The resulting output can also be a resistance, voltage, current or other electrical value.

With the embodiment of FIG. 3, if the source memristor is, for example, a sensor, then the replication process described above can be used to read and store the sensed value at a particular time. The destination memristor can be one of an array of such memristors that are selectable and each programmed in turn over time to store the sensed values for later retrieval. It is, of course, not essential to have a source memristor, and the reading and storing could simply be done of any electrical value, such as an input voltage as in the circuit of FIG. 2.

This technique of reading and storing an electrical value is advantageous because it is does not require significant digital circuitry, so can be compact and low-power. This makes is especially suited to remote sensing applications.

Another embodiment of the invention is illustrated in FIG. 4, based on the circuit of FIG. 2, but with the addition of a counter 20. The counter 20 counts the number of programming voltage pulses $V_{prog}$ that are applied to the memristor $M_D$ until the programming is stopped, and then outputs that number, for example as an n-bit binary number. This output number is related to the input analog electrical value (e.g. voltage) at terminal 16. Thus the circuit acts as an analog-to-digital converter (ADC). The circuit also acts as an encoder, turning an input value into a unique number. The encoding is non-linear because it depends on properties such as the electrical characteristics of the memristor $M_D$ (as well as on parameters such as the $V_{prog}$, $T_{prog}$). This makes the encoding secure because the actual output numerical value is meaningless without knowledge of the memristor properties, i.e. one cannot decode the number back to obtain the original input value without at least access to or prior knowledge of these properties and parameters, and even trends in the numbers are not useful because of the non-linearity. Thus the generated code (number) is effectively unique to the specific memristor used to generate it, and so is locked to that specific device.

Any of the embodiments described herein can, of course, be combined with any of the other embodiments, or with features thereof, as appropriate. So, the source memristor potential divider of FIG. 3 can be used with the circuit of FIG. 4. This would enable the source memristor value to be read, backed-up and simultaneously output as a digital value, all with a single, simple circuit.

Figure 5:
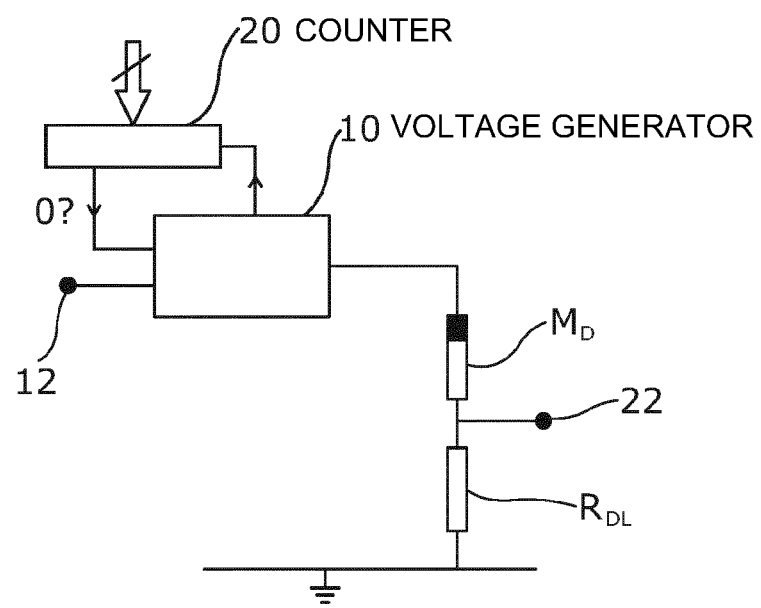
FIG. 5 is a schematic circuit diagram of a memristor-based decoder (or digital-to-analog converter (DAC)) circuit according to an embodiment of invention.

Following on from the encoder circuit of FIG. 4, the circuit of FIG. 5 provides a corresponding decoder. A number C is input to the counter 20 as an initial count value, and in this case the counter is configured as a down-counter; the memristor $M_D$ is initialized to be in a low-resistance state $R_{ON}$. When the clock signal clk is now applied to terminal 12, the resistance of the destination memristor is incrementally changed by the programming voltage pulses. Each time a voltage pulse is applied, the counter 20 is decremented. When the counter reaches zero, this is signaled as an output that stops the voltage generator 10 from applying further programming voltage pulses, and instead just applies $V_{hold}$. The memristor $M_D$ has had precisely C programming pulses applied to it. The voltage on terminal 22 of the potential divider is now an analog value based on the input number C i.e. the number C has been uniquely decoded (non-linearly) to the voltage at terminal 22. Thus this circuit also acts as a digital-to-analog converter (DAC).

The circuits of FIGS. 4 and 5 can also each be used as authenticators for authentication checking purposes. The inputs are an analog voltage and a digital number (FIG. 4 and FIG. 5), respectively, and the corresponding outputs are a digital number and an analog voltage. The input and output form a Challenge-Response-Pair (CRP). In one implementation, the memristor $M_D$ is provided in an external circuit, such as in a chip in a piece of electronics or in an IC-card, such as a bank card, and is connected to the rest of the respective circuit. The expected responses (outputs) based on one or more challenges (inputs) are known to the entity seeking to authenticate. If the memristor is authentic then the correct response(s) will be obtained (within defined error margins), and the chip/electronics can be verified as authentic. If the original memristor is not used, then the correct response will not be obtained, and authentication can be denied. Unauthorized copies of the memristor cannot readily be made because the electronic properties of the memristor are strongly dependent on the fabrication parameters and are non-linear, as discussed further below. Thus the chip/electronics can be tagged and identified using the memristor, and cannot be subject to cloning.

Figure 6:
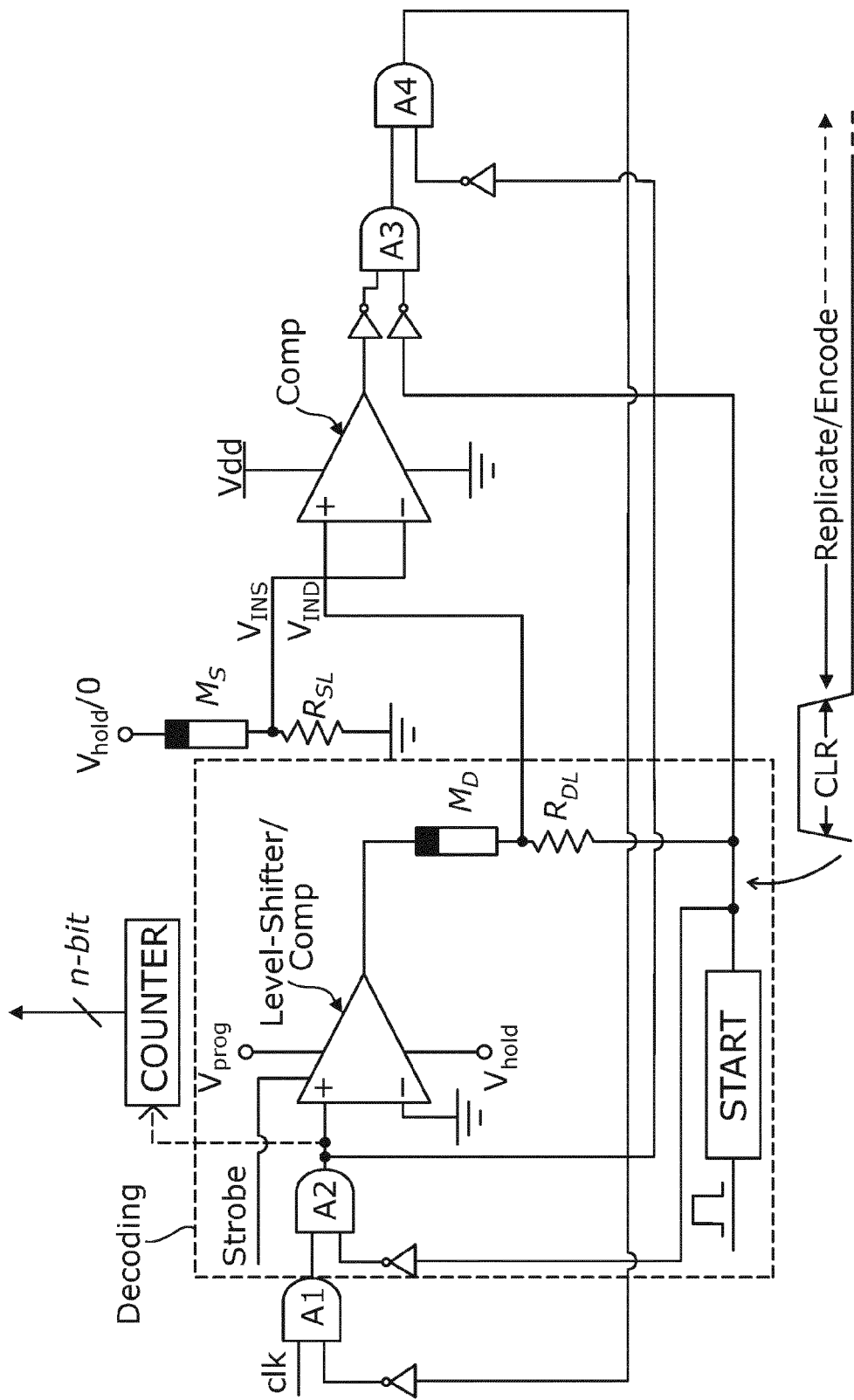
FIG. 6 is a more detailed circuit diagram of a memristor-based replicator/encoder/decoder according to another embodiment of invention.

FIG. 6 shows an embodiment of a specific architecture for replicating a source memristor $M_S$ to a destination memristor $M_D$ within certain quantization limits. The memristors $M_S$, $M_D$ and the load resistors, $R_{SL}$ and $R_{DL}$, form two voltage dividers. $R_{SL}$ and $R_{DL}$ are assumed to be closely matched. The output voltages of the voltage dividers $V_{INS}$ and $V_{IND}$ are continually compared by the comparator Comp. The architecture is simple, power efficient, and requires a small number of logic gates, a comparator, a level-shifter (also known as a voltage translator, and effectively a form of comparator, and which performs the function of the voltage generator 10 in the previously described embodiments), and an edge-sensitive counter. In the preferred embodiment, the level-shifter is 'strobed', i.e. enabled or disabled according to whether power is supplied to the power input line of the level-shifter indicated 'Strobe' in FIG. 6.

A. Replication and Encoding: Let $f_{rep}$ be the replication frequency of the clock (clk) and $T_{rep}=T_{prog}+T_{hold}=1/f_{rep}$ be the clock cycle. Voltages $V_{prog}$ and $V_{hold}$ are alternatively applied during $T_{prog}$ and $T_{hold}$. $V_{prog}$ is adjusted to be sufficiently high so that $V_W$ appears across memristor $M_D$ only even with the load $R_{DL}$. Similarly, $V_{hold}$ is adjusted to be sufficiently high such that a $V_R$ appears across both memristors $M_S$ and $M_D$ simultaneously. Hence resistance of memristor $M_S$ is copied to memristor $M_D$ by repeatedly applying these pulses based on Equation 2. During each $T_{prog}$, $V_{prog}$ shifts the barrier of $M_D$ from the $R_{on}$ region towards the $R_{off}$ region by a small amount, but non-linearly, and during the following $T_{hold}$, memristances of $M_D$ and $M_S$ are compared. The counter at the top counts the number of clock pulses required to replicate.

The replication starts by first resetting the counter and a 'CLR' pulse applied to the negative terminal of memristor $M_D$. This pulse is of sufficient amplitude such that a very short duration resets memristor $M_D$ to $R_{on}$. The first stage of the counter is used to generate the pulse and once CLR is complete the counter is reused for encoding. During CLR: the level-shifter is disabled via the strobe input; AND gates A2 and A3 block the inputs and produce a constant zero. Hence, the clock signal clk is prevented from reaching the level-shifter. As a result, the level-shifter produces 0 at the P-terminal of memristor $M_D$ and the high CLR pulse at its N-terminal resets memristor $M_D$ to $R_{on}$.

When CLR returns to 0, the level-shifter and the AND gates A2 and A3 are enabled and the replication starts. A2 passes clk to the level-shifter which switches between $V_{prog}$ and $V_{hold}$ in the same cycle ($T_{rep}$). $V_{prog}$ shifts the barrier of memristor $M_D$ during $T_{prog}$, and the resulting voltage is compared with that across memristor $M_S$ during $T_{hold}$ by the comparator Comp. During $T_{hold}$ the comparator keeps producing a 1 until the voltage across memristor $M_D$ exceeds that across memristor $M_S$. This forces A3 and A4 to produce a 0, which lets A1 pass clk through to the level-shifter. As a result the voltage across memristor $M_D$ gradually increases during each clock cycle, until it exceeds that across memristor $M_S$ at which point the comparator produces a 0 during $T_{hold}$. This forces A3 and A4 to produce a 1, and the level-shifter is disabled via the strobe. This stops A1 from letting clk through thereby indicating an end of replication. Essentially the circuit enters a 'locked' state which is controlled by the voltage across memristor $M_D$. During replication, the counter counts the number of clock cycles required to replicate, which is the encoded digital value for analog voltage (resistance) of memristor $M_S$. Hence, the proposed architecture performs non-linear encoding of the analog voltage/resistance while the replication takes place.

As mentioned, when replication (or encoding conversion) is complete, the level-shifter is disabled by the stopping applying the power supply (Vdd) to the 'strobe' input. This means that the level-shifter produces a 0 V output as opposed to $V_{hold}$; so zero voltage is applied to the memristor $M_D$, to avoid undesirably applying a persistent voltage across the memristor for long periods. The power switching or strobing can be achieved using a single PMOS or NMOS transistor.

After this, a second phase of replication can start by the CLR pulse, which resets memristor $M_D$ thereby bringing the system out of the locked state (having enabled the level-shifter).

The accuracy depends on the width of $T_{prog}$ for a fixed $V_{prog}$, and lower $T_{prog}$ results in higher accuracy, but at the cost of increased replication/conversion time.

If the source memristor $M_S$ resistance (or equivalently, the voltage $V_{INS}$) is stable, then the replicating/encoding process will terminate naturally. However, in applications where $V_{INS}$ is changing over time (such as in sensor applications), the counter may continue to increase as the circuit tries to match $V_{INS}$ and $V_{IND}$, which can be undesirable. One alternative embodiment is to include a latch (such as a SR flip-flop, D flip-flop, etc.) between the output of the comparator and the input of the level-shifter (voltage generator), such as between gate A4 and gate A1. The latch will operate to 'lock' in the reading (counter value and/or memristance) at the first instance when $V_{IND}$ matches $V_{INS}$, which is appropriate for some applications. However, this can be undesirable in other situations, so another embodiment of the invention is to have a predetermined 'sense' period of time, and the clock is stopped automatically after that preset sense period has elapsed to give the reading then. The sense period can be made sufficiently long relative to $T_{rep}$ such that $V_{IND}$ will have time to match $V_{INS}$.

B. Decoding: If, while replicating, the counter registered digital value C. Decoding is achieved by first clearing memristor $M_D$ with CLR and by 'programming' it with the same $V_{prog}$ and $V_{hold}$ at the same frequency $f_{rep}=1/(T_{prog}+T_{hold})$ for C number of cycles. A part of the decoder logic appears in the dashed box in FIG. 6 labelled 'decoder'. A down counter (not shown), initialized to C, is used to count the number of clock cycles. After decoding, $V_{hold}-V_{DL}$, where $V_{DL}$ is the voltage drop across $R_{DL}$, divided by the current gives the corresponding encoded resistance within quantization limits.

C. Security and Physical Uncloneability: The circuit architecture provides a certain level of inherent security by virtue of non-linear encoding. The encoded value C is a function of $V_W$, $T_{prog}$, $T_{hold}$, and $M_D$ itself. Hence, it is extremely challenging to guess what resistance or voltage C represents without having full knowledge of these quantities. Additionally, obtaining access to an almost exact matching memristor to $M_D$ provides further challenge and difficulty.

Figure 7:
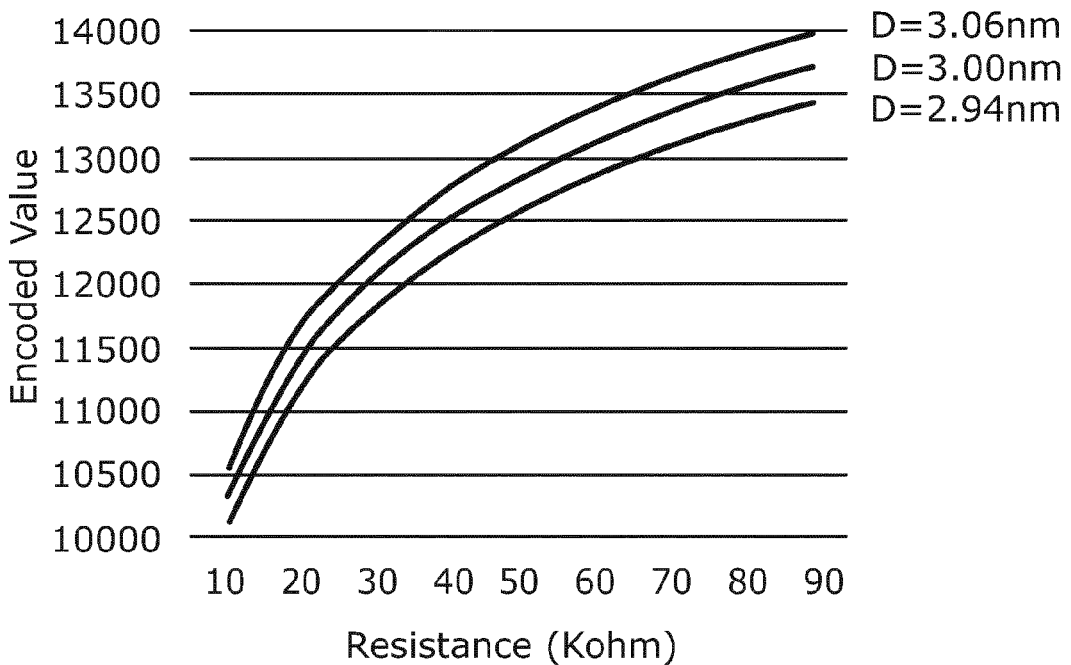
FIG. 7 shows graphs of encoded digital output for different memristor dimensions.

The architecture also provides physical uncloneability by virtue of non-linearity as well as its sensitivity to process and parametric variations. As revealed by experimental results, the non-linear code depends heavily on the physical parameters of the memristor $M_D$, e.g. the length dimension D, threshold voltage, etc. Any small variations in these are amplified by the counting based encoding mechanism and results in different codes (FIG. 7). Hence, any two fabricated chips are likely to produce different codes for the same input voltage/resistance thereby making it very hard to clone.

While this architecture is geared towards replicating memristors, it can also be used for non-linear encoding/decoding and for Challenge-Response-Pair (CRP) based authentication. Instead of memristor $M_S$, in FIG. 6 $V_{INS}$ can be an input voltage serving as a challenge. After encoding, the contents of the counter can serve as a unique non-linear response. Additionally, this response will vary from chip to chip owing to its physical uncloneability thereby also offering provisions for chip identification/tagging. The analog input voltage at $V_{INS}$ can be obtained from a lightweight encryption hardware or a hash function generator, e.g. a linear feedback shift register, for added security.

In the preceding embodiments of the invention, the memristor $M_D$ is initialized to be in a low-resistance state $R_{ON}$ and the application of voltage pulses progressively increases the resistance towards the high-resistance state $R_{OFF}$, until a defined condition is satisfied. However, alternate embodiments of the invention can equally operate by the memristor $M_D$ being initialized to be in a high-resistance state $R_{OFF}$ and then applying voltage pulses (of the opposite polarity to that in the preceding embodiments) to negatively incrementally change the resistance towards the low-resistance state $R_{ON}$, until a defined condition is satisfied (for example as detected by a comparator with input terminals swapped over relative to the preceding embodiments).

Experimental Results: the memristors were coded using the above model, and the circuits were simulated. The 32 nm technology node was used for the experiments with $V_{prog}$=41 mV, $V_{hold}$=20 mV, $T_{prog}$=2.5 ns, $R_{SL}$=$R_{DL}$=1 KΩ, $R_{on}$=1 KΩ, $R_{off}$=100 KΩ, D=3 nm, $K_{off}$=5e-4, $K_{on}$=-10, $α_{on}$=3, $α_{off}$=1, $V_{on}$=-0.2 and $V_{off}$=0.02. Table 1 shows the results as $M_S$ was varied from 10 KΩ to 90 KΩ. Clearly, the encoded value is non-linear in nature and maintains low percentage error in copying the resistance to the destination memristor $M_D$.

TABLE 1

Replication/Encoding ($R_{on}$ = 1 KΩ, $R_{off}$ = 100 KΩ).
$V_{prog}$ = 41 mV, $V_{hold}$ = 20 mV.$T_{prog}$ = 2.5 ns, $R_{SL}$ = $R_{DL}$ = 1 KΩ

| $M_S$ KΩ | $M_D$ KΩ | Time μsec | % Err | Enc Val |
|---|---|---|---|---|
| 10 | 10.0555 | 51.6685 | 0.555 | 10334 |
| 20 | 20.0525 | 57.2435 | 0.263 | 11449 |
| 30 | 30.051 | 60.3387 | 0.170 | 12068 |
| 40 | 40.0749 | 62.4987 | 0.187 | 12500 |
| 50 | 50.070 | 64.1536 | 0.140 | 12831 |
| 60 | 60.0617 | 65.4987 | 0.103 | 13100 |
| 70 | 70.0653 | 66.6337 | 0.0933 | 13327 |
| 80 | 80.0566 | 67.6136 | 0.0708 | 13523 |
| 90 | 90.068 | 68.4787 | 0.0756 | 13696 |

The circuit architecture inherently provides a particular level of security by virtue of non-linear encoding as shown in FIG. 7. This figure also shows that a small variation in the physical parameters of memristor $M_D$ results in different analog-to-digital transfer characteristics.

Figure 8:
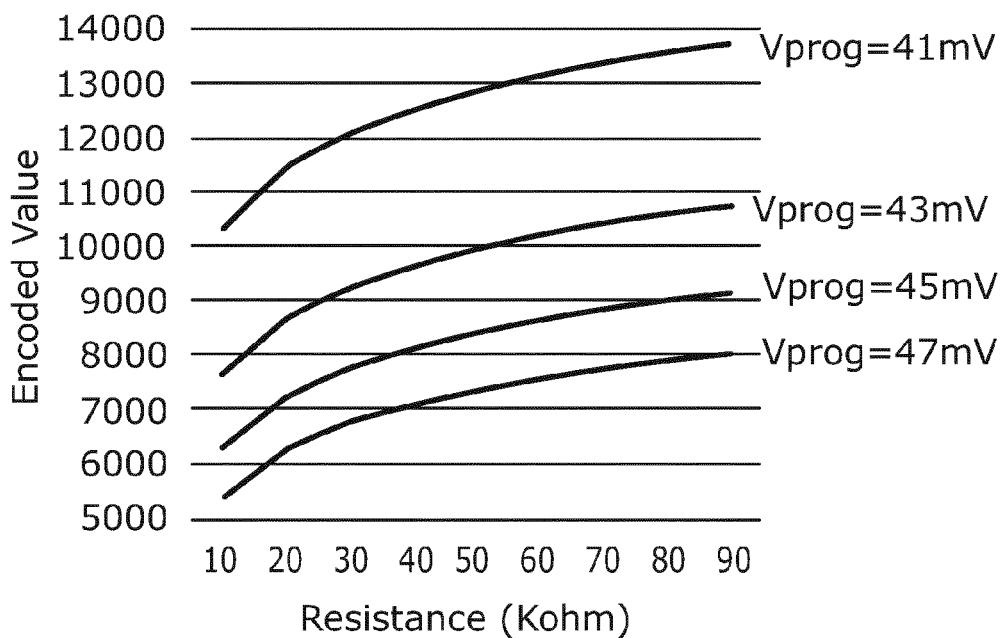
FIG. 8 shows graphs of encoded digital output for different programming pulse voltages.
Figure 9A:
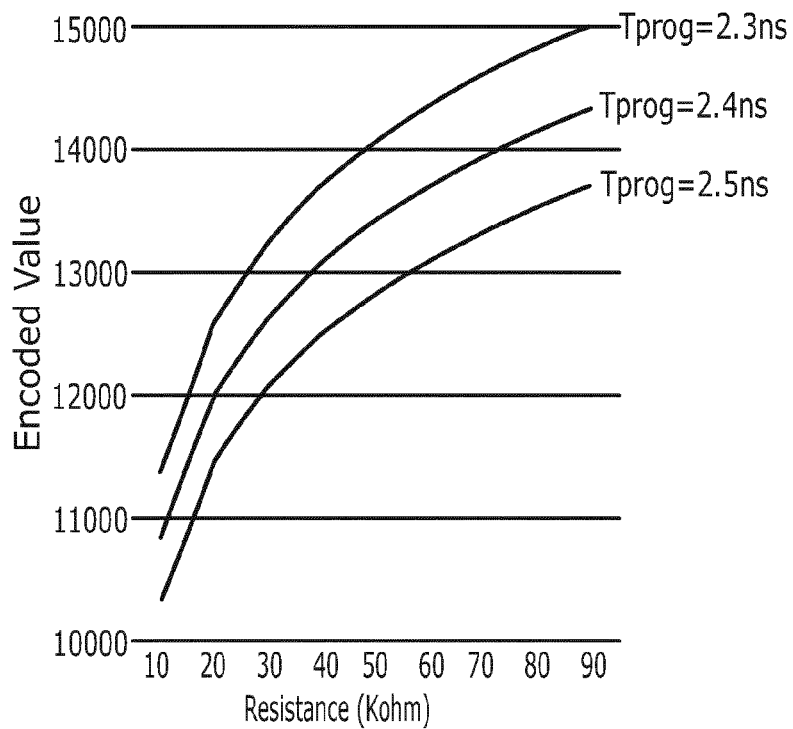
FIGS. 9A and 9B are graphs showing the effect on encoded value of different programming pulse widths.
Figure 9B:
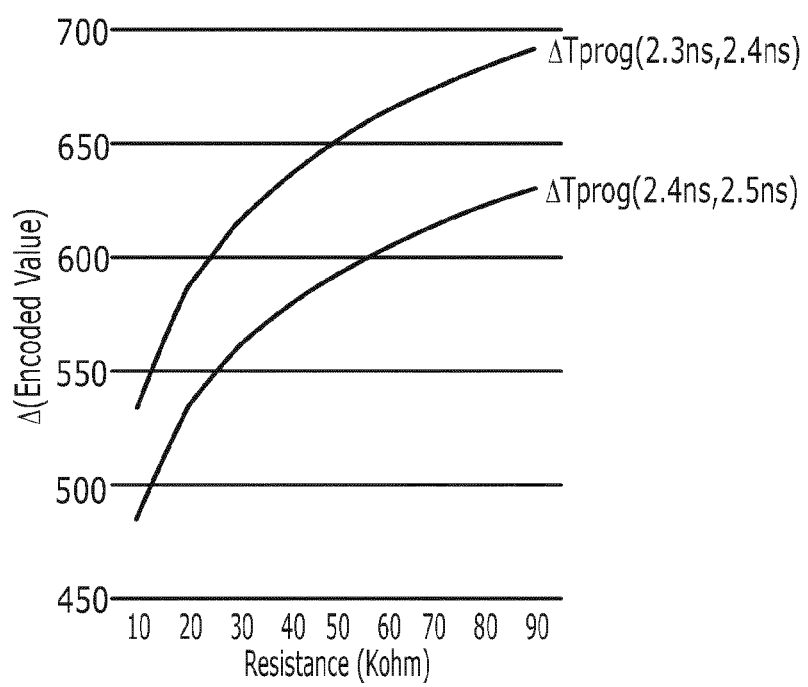

FIG. 8 and FIGS. 9A & 9B show the results of varying $V_{prog}$ and $T_{prog}$ respectively while keeping the other parameters fixed. As can be seen the behavior of the architecture is non-linear through-out, i.e. it is non-linear for specific $V_{prog}$ or $T_{prog}$ and also for their differences.

Embodiments of a novel memristor replicator circuit architecture, capable of replicating a source memristor to a destination memristor, have been disclosed herein. This architecture is also capable of generating non-linear digital codes and can provide additional security features and physical uncloneability. The architecture is lightweight and relies only on a few logic components, two comparators (one functioning as a level-shifter), and a counter. Experimental results show that this architecture is capable of outperforming existing designs in terms of chip area, power consumption and performance reliability. The architecture is extremely versatile and can be used in applications for backing up analog data (e.g. sensed information) especially in remote sensor nodes, non-linear encoding, chip tagging/identification, as well as for preventing unauthorized chip fabrications.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A memristor-based circuit comprising:
   a memristor;
   a voltage generator arranged to apply a series of voltage pulses to the memristor to incrementally change a resistance of the memristor; and
   a comparator arranged to receive an input first electrical value, to receive a second electrical value based on the resistance of the memristor, to compare the first electrical value with the second electrical value, and to enable the application of the voltage pulses to the memristor by the voltage generator until a result of the comparing satisfies a predefined condition.

2. The circuit according to claim 1 wherein the input first electrical value is an input voltage, and the second electrical value is a voltage obtained from a potential divider circuit including the memristor.

3. The circuit according to claim 1 wherein the memristor is a destination memristor and including a source memristor in a potential divider circuit providing the input first electrical value, whereby a resistance of the source memristor is replicated in the resistance of the destination memristor when the predefined condition is satisfied.

4. An encoder comprising:
   the circuit according to claim 1; and
   a counter arranged to count a number of the voltage pulses applied to the memristor, and to output the number counted as a representation of the input first electrical value.

5. An analog-to-digital converter comprising the encoder according to claim 4 wherein the input first electrical value is an analog input, and the number counted output is a digital output.

6. An authentication circuit comprising:
   the encoder according to claim 4 wherein the memristor is included in an external circuit connectable to the authentication circuit; and
   wherein when the memristor in the external circuit is connected to the authentication circuit, the input electrical value represents a challenge, and the output number counted is a response based on the memristor in the external circuit.

7. The authentication circuit according to claim 6 wherein the external circuit comprises a chip that is tagged or identified by the memristor.

8. A decoder comprising:
   a memristor;

a voltage generator arranged to apply a series of voltage pulses to the memristor to incrementally change a resistance of the memristor; and a counter, arranged to receive a number as an input, and arranged to cause the voltage generator to apply the series of voltage pulses as a number of the voltage pulses corresponding to the received number.

9. The decoder according to claim 8 wherein the counter is a down-counter initialized to the received number, the counter being configured to decrement each time one of the voltage pulses is applied by the voltage generator to the memristor, and being configured to stop the application of the voltage pulses to the memristor by the voltage generator when the decremented count value reaches zero.

10. A digital-to-analog converter comprising the decoder according to claim 8 wherein the received number is a digital input, and an electrical value based on the resistance of the memristor is an analog output.

11. An authentication circuit comprising:

the decoder according to claim 8 wherein the memristor is included in an external circuit connectable to the authentication circuit; and wherein when the authentication circuit is connected to the memristor included in the external circuit, the input electrical value represents a challenge, and the output number counted is a response based on the memristor of the external circuit.

12. The authentication circuit according to claim 11 wherein the external circuit comprises a chip that is tagged or identified by the memristor.

13. A method comprising:

receiving an input first electrical value;

applying a series of voltage pulses to a memristor to incrementally change a resistance of the memristor;

receiving a second electrical value based on the resistance of the memristor;

comparing the first electrical value with the second electrical value; and enabling the application of the voltage pulses to the memristor until a result of the comparing satisfies a predefined condition.

14. The method according to claim 13 wherein the input first electrical value is an input voltage, and the second electrical value is a voltage obtained from a potential divider circuit including the memristor.

15. The method according to claim 13 wherein the memristor is a destination memristor and a source memristor in a potential divider circuit provides the input first electrical value, and whereby a resistance of the source memristor is replicated in the resistance of the destination memristor.

16. The method according to claim 13 including a step of counting a number of the voltage pulses applied to the memristor, and outputting the counted number.

17. A method comprising:

receiving a number as an input;

applying a series of voltage pulses to a memristor to incrementally change a resistance of the memristor;

counting the voltage pulses being applied until a number of the applied voltage pulses equals the input number received; and outputting an electrical value based on the resistance of the memristor when the counted number equals the input number received.

* * * * *